(12) United States Patent
Matsushita et al.

(10) Patent No.: US 11,051,398 B2
(45) Date of Patent: Jun. 29, 2021

(54) CERAMIC ELECTRONIC COMPONENT

(71) Applicant: Murata Manufacturing Co., Ltd., Kyoto (JP)

(72) Inventors: Yosuke Matsushita, Kyoto (JP); Issei Yamamoto, Kyoto (JP); Shigeru Endo, Kyoto (JP); Yoshihito Otsubo, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 366 days.

(21) Appl. No.: 16/265,047

(22) Filed: Feb. 1, 2019

(65) Prior Publication Data

US 2019/0208622 A1 Jul. 4, 2019

Related U.S. Application Data

(63) Continuation of application No. PCT/JP2017/027652, filed on Jul. 31, 2017.

(30) Foreign Application Priority Data

Aug. 10, 2016 (JP) .............................. JP2016-157813

(51) Int. Cl.
*H01G 4/30* (2006.01)
*H05K 1/02* (2006.01)
(Continued)

(52) U.S. Cl.
CPC ....... *H05K 1/0237* (2013.01); *H01F 17/0013* (2013.01); *H01F 27/2804* (2013.01);
(Continued)

(58) Field of Classification Search
CPC .................................................... H05K 1/0237
(Continued)

(56) References Cited

U.S. PATENT DOCUMENTS

2001/0032383 A1   10/2001   Haratani et al.
2010/0194513 A1    8/2010   Ozawa et al.
(Continued)

FOREIGN PATENT DOCUMENTS

JP    2000-049033 A    2/2000
JP    2000-286617 A   10/2000
(Continued)

OTHER PUBLICATIONS

International Search Report for International Application No. PCT/JP2017/027652 dated Oct. 24, 2017.
(Continued)

*Primary Examiner* — Stanley Tso
(74) *Attorney, Agent, or Firm* — Pearne & Gordon LLP

(57) ABSTRACT

A ceramic electronic component according to the present disclosure includes a ceramic insulator and conductor portions including inner conductors disposed inside the ceramic insulator and outer conductors disposed outside the ceramic insulator, wherein each conductor portion has a surface and a back surface opposite to the surface, and at least one of the conductor portions includes a flat portion in which the conductor thickness is constant, surface corner portions having a round-chamfered shape in the direction from the surface toward the back surface of the inner conductor or the outer conductor, and back surface corner portions having a round-chamfered shape in the direction from the back surface toward the surface of the inner conductor or the outer conductor.

16 Claims, 4 Drawing Sheets

(51) Int. Cl.
| | |
|---|---|
| *H01G 4/232* | (2006.01) |
| *H01F 17/00* | (2006.01) |
| *H01F 27/28* | (2006.01) |
| *H01F 41/04* | (2006.01) |
| *H01G 4/012* | (2006.01) |
| *H01P 3/08* | (2006.01) |
| *H05K 1/03* | (2006.01) |
| *H05K 1/11* | (2006.01) |
| *H05K 3/46* | (2006.01) |
| *H01P 1/203* | (2006.01) |
| *H01G 4/248* | (2006.01) |

(52) U.S. Cl.
CPC .......... *H01F 41/043* (2013.01); *H01G 4/012* (2013.01); *H01G 4/232* (2013.01); *H01G 4/30* (2013.01); *H01P 3/081* (2013.01); *H05K 1/0306* (2013.01); *H05K 1/115* (2013.01); *H05K 3/4644* (2013.01); *H01F 2027/2809* (2013.01); *H01G 4/248* (2013.01); *H01P 1/203* (2013.01); *H05K 3/4629* (2013.01); *H05K 2201/10015* (2013.01); *H05K 2201/10522* (2013.01); *H05K 2201/10734* (2013.01)

(58) Field of Classification Search
USPC .......................................................... 336/192
See application file for complete search history.

(56) References Cited

U.S. PATENT DOCUMENTS

| | | | | |
|---|---|---|---|---|
| 2016/0027569 | A1* | 1/2016 | Inoue | H01F 17/04 336/192 |
| 2016/0172110 | A1* | 6/2016 | Otani | H01L 41/0472 361/301.4 |
| 2016/0196906 | A1* | 7/2016 | Kim | H01F 17/0013 336/192 |

FOREIGN PATENT DOCUMENTS

| | | | |
|---|---|---|---|
| JP | 2003-174261 | A | 6/2003 |
| JP | 2004-356333 | A | 12/2004 |
| JP | 2006-060080 | A | 3/2006 |
| JP | 2006-191145 | A | 7/2006 |
| JP | 2010-192889 | * | 9/2010 |
| JP | 2010-192889 | A | 9/2010 |
| JP | 2010-251597 | A | 11/2010 |
| JP | 2011-010154 | A | 1/2011 |
| JP | 5319910 | B2 | 10/2013 |
| JP | 5370330 | B2 | 12/2013 |
| JP | 2015-041693 | A | 3/2015 |

OTHER PUBLICATIONS

Written Opinion for International Application No. PCT/JP2017/027652 dated Oct. 24, 2017.

* cited by examiner

CERAMIC ELECTRONIC COMPONENT

This is a continuation of International Application No. PCT/JP2017/027652 filed on Jul. 31, 2017 which claims priority from Japanese Patent Application No. 2016-157813 filed on Aug. 10, 2016. The contents of these applications are incorporated herein by reference in their entireties.

BACKGROUND OF THE DISCLOSURE

Field of the Disclosure

The present disclosure relates to a ceramic electronic component.

Description of the Related Art

Ceramic electronic components, for example, multilayer ceramic substrates and multilayer ceramic capacitors, include ceramic insulators, inner conductors embedded in the ceramic insulators, and outer conductors disposed on the outer surfaces of the ceramic insulators.

Patent Document 1 discloses a structure in which Cu foil having a trapezoidal shape processed by etching or the like is disposed on an insulator and a plurality of resulting layers are stacked.

Meanwhile, a technology to form a wiring conductor or a via hole electrode by screen-printing an insulator with a conductive paste is known.

Patent Document 1: Japanese Unexamined Patent Application Publication No. 2006-191145

BRIEF SUMMARY OF THE DISCLOSURE

FIG. 6A is a schematic sectional view showing the cross-sectional shape of an electrode formed by etching a metal foil, described in Patent Document 1, and FIG. 6B is a schematic sectional view showing the cross-sectional shape of an electrode formed by applying a conductive paste by screen printing.

When a high-frequency signal is transmitted by using an electrode having a cross-sectional shape as shown in FIG. 6A, the current density in the electrode end portion increases due to an influence of an edge effect generated at the electrode end portion (a portion surrounded by dotted line A in FIG. 6A). As a result, a problem occurs in that an insertion loss increases. Meanwhile, as shown in FIG. 6B, when an electrode is formed by applying a conductive paste by screen printing, a problem also occurs in that characteristics are degraded due to the edge effect because the electrode end portion (a portion surrounded by a dotted line B in FIG. 6B) has a pointed shape.

In this regard, as the cross-sectional shape of the electrode approaches a circle, there are advantages in improving the degradation of the characteristics due to the edge effect. However, if the cross-sectional shape of the electrode is set to be circular, the width and the thickness of the electrode become constant. Consequently, the application to the multilayer structure makes compatibility with a reduction in profile difficult. To decrease the thickness of the electrode, the width of the electrode has to also be decreased and, therefore, there is a concern that the characteristics may be degraded due to a reduction in the cross-sectional area.

The present disclosure was realized to address the above-described problems, and it is an object to provide a ceramic electronic component in which the degradation of the characteristics due to the edge effect can be suppressed and compatibility with a reduction in profile can be ensured.

To achieve the above-described object, a ceramic electronic component according to the present disclosure includes a ceramic insulator and conductor portions including inner conductors disposed inside the ceramic insulator and outer conductors disposed outside the ceramic insulator, wherein each conductor portion has a surface and a back surface opposite to the surface, and at least one of the conductor portions includes a flat portion in which the conductor thickness is constant, surface corner portions having a round-chamfered shape in the direction from the surface toward the back surface of the inner conductor or the outer conductor, and back surface corner portions having a round-chamfered shape in the direction from the back surface toward the surface of the inner conductor or the outer conductor.

Regarding the conductor portion in the ceramic electronic component according to the present disclosure, the shape of the end portion is a round-chamfered shape and is not a shape with a pointed end. Consequently, the degradation of the characteristics due to the edge effect can be suppressed. In addition, the conductor portion includes a flat portion in which the conductor thickness is constant. When the shape of the end portion of the conductor portion is a round-chamfered shape, the degradation of the characteristics due to the edge effect can be improved and, therefore, it is acceptable to provide a flat portion without setting the cross-sectional shape of the electrode to be circular. The thickness of the conductor portion is determined by the thickness of the flat portion, and compatibility with a requirement for a reduction in profile can be ensured by decreasing the thickness of the flat portion.

In the ceramic electronic component according to the present disclosure, preferably, the conductor portion including the surface corner portions and the back surface corner portions is an inner conductor.

In the ceramic electronic component according to the present disclosure, preferably, the end near the back surface of each of the surface corner portions is connected to the end near the surface of each of the back surface corner portions. Alternatively, it is preferable that a flat side surface be present between the end near the back surface of each of the surface corner portions and the end near the surface of each of the back surface corner portions.

In either aspect, a pointed shape is not present at the end of the conductor portion and, therefore, the degradation of the characteristics due to the edge effect can be suppressed.

In the ceramic electronic component according to the present disclosure, preferably, the curvature radius of each of the surface corner portions is different from the curvature radius of each of the back surface corner portions.

In particular, it is preferable that the conductor portion including the surface corner portions and the back surface corner portions be a transmission line of a microstrip line and that the curvature radius of each of the back surface corner portions located near the ground be greater than the curvature radius of each of the surface corner portions. Regarding the transmission line represented by the microstrip line, when the curvature radius at a position opposite to the ground is increased, the concentration of the electric field on an electrode end portion can be relaxed, and the improved transmission characteristics can be realized.

In the ceramic electronic component according to the present disclosure, preferably, the width of the conductor portion including the surface corner portions and the back surface corner portions of the surface is different from the width of the conductor portion of the back surface.

In particular, it is preferable that the conductor portion including the surface corner portions and the back surface corner portions be an inner electrode layer of a multilayer ceramic capacitor. Alternatively, it is preferable that the conductor portion including the surface corner portions and the back surface corner portions be an inner electrode layer of a multilayer ceramic coil.

When the width of the conductor portion including the surface corner portions and the back surface corner portions of the surface is different from the width of the conductor portion of the back surface, the cross-sectional shape of the conductor portion is substantially trapezoidal.

Regarding the multilayer ceramic capacitor or the multilayer ceramic coil in which electrodes having a trapezoidal cross-sectional shape are stacked, the amount of the fluctuation in the characteristics due to the positional deviation of the electrode can be reduced.

In the ceramic electronic component according to the present disclosure, preferably, a plurality of types of conductor portions which include the surface corner portions and the back surface corner portions and in which the widths of the conductor portions of the surfaces are different from each other are present, and regarding each conductor portion, the difference between the width of the surface of the conductor portion and the width of the back surface of the conductor portion increases as the width of the conductor portion of the surface increases. Regarding the portion in which the width of the conductor portion is large (a portion for forming a capacitance), as the above-described difference in the width increases, the effect of reducing the amount of fluctuation in the capacitance characteristics is enhanced.

On the other hand, regarding the portion in which the width of the conductor portion is small (a fine wiring portion), as the above-described difference in the width decreases, the cross-sectional area does not excessively decreases and, therefore, the degradation of transmission characteristics is effectively suppressed. As a result, regarding the portion in which the width of the conductor portion is large, it is preferable that the difference between the width of the conductor portion of the surface and the width of the conductor portion of the back surface be increased, and regarding the portion in which the width of the conductor portion is small, it is preferable that the difference between the width of the conductor portion of the surface and the width of the conductor portion of the back surface be decreased.

In the ceramic electronic component according to the present disclosure, preferably, an embedded conductor portion that includes the surface corner portions and the back surface corner portions and that is a conductor portion embedded in the ceramic insulator is present, and the surface of a ceramic layer constituting the ceramic insulator and the surface of the embedded conductor portion form a flat surface.

When the end portion of the conductor portion has a round-chamfered shape, the concentration of stress in the end portion is relaxed during embedding the conductor portion into the ceramic insulator, and the generation of structural defects, for example, a crack, is suppressed.

In addition, the coplanarity of the entire electronic component can be improved and the risk of an interlayer short circuit can be reduced by forming a flat surface on a ceramic layer basis.

In the ceramic electronic component according to the present disclosure, preferably, the ceramic insulator is an insulator in which a plurality of ceramic layers are stacked, the conductor portion including the surface corner portions and the back surface corner portions includes a wiring conductor portion and an interlayer connection conductor portion that establishes electrical connection through a plurality of ceramic layers, and the composition of the material for constituting the interlayer connection conductor portion has a larger content of ceramic component than the composition of the material for constituting the wiring conductor portion.

Regarding the interlayer connection conductor portion, a larger content of ceramic component in the conductor portion is advantageous from the viewpoint of the exertion of a shrinkage suppression effect. On the other hand, regarding the wiring conductor portion, a relatively small content of ceramic component in the conductor portion is advantageous from the viewpoint of an improvement of the transmission characteristics.

In the ceramic electronic component according to the present disclosure, preferably, the ceramic insulator is an insulator in which a plurality of ceramic layers are stacked, the conductor portion including the surface corner portions and the back surface corner portions includes a wiring conductor portion and an interlayer connection conductor portion that establishes electrical connection through a plurality of ceramic layers, and the composition of the material for constituting the interlayer connection conductor portion is the same as the composition of the material for constituting the wiring conductor portion. When the composition of the material for constituting the interlayer connection conductor portion is the same as the composition of the material for constituting the wiring conductor portion, there is an advantage from the viewpoint of relaxing the stress applied during the firing shrinkage.

The present disclosure can provide a ceramic electronic component in which the degradation of the characteristics due to the edge effect can be suppressed and the compatibility with a reduction in profile can be ensured.

DETAILED DESCRIPTION OF THE DISCLOSURE

A ceramic electronic component according to the present disclosure will be described below.

However, the present disclosure is not limited to the configuration described below and the configuration can be appropriately modified and applied within the bounds of not changing the gist of the present disclosure.

The present disclosure also includes combinations of at least two of the individual desirable configurations of the present disclosure described below.

It is needless to say that each of the embodiments described below is an exemplification and that configurations shown in different embodiments can be partly replaced or combined with each other.

Ceramic electronic components according to the present disclosure are roughly divided into multilayer ceramic substrates and chip components such as an LC composite component that is mounted on a substrate, for example, a multilayer ceramic substrate.

To begin with, an example of the configuration of a ceramic component according to the present disclosure, in particular, an example of a position at which a conductor portion is disposed, will be described with reference to the examples of the multilayer ceramic substrate and the chip component.

Figure 1:
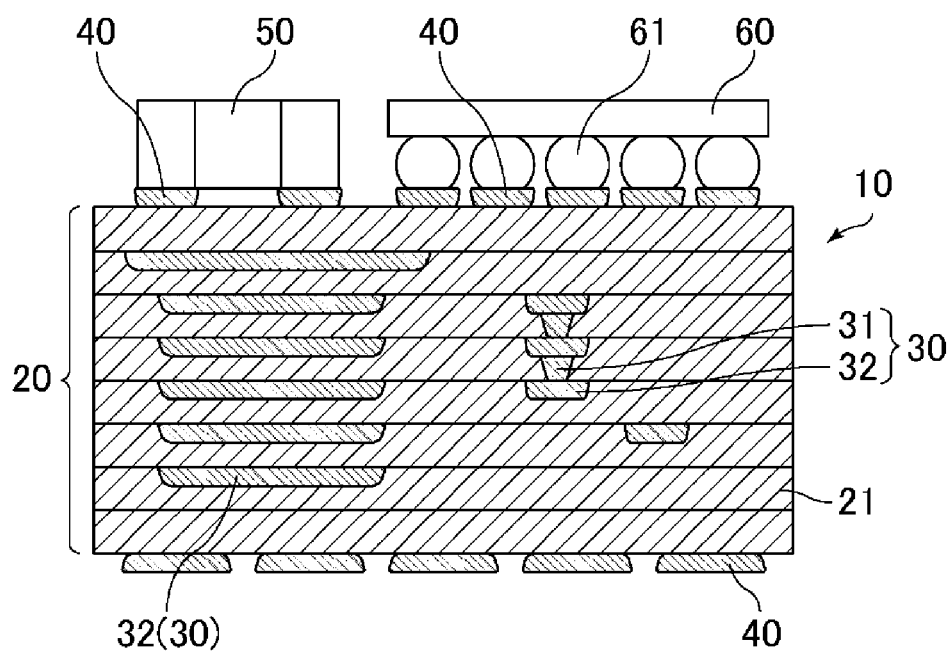
FIG. 1 is a schematic sectional view showing an example of a multilayer ceramic substrate.

FIG. 1 is a schematic sectional view showing an example of a multilayer ceramic substrate.

A multilayer ceramic substrate 10 as shown in FIG. 1 includes a ceramic insulator 20 in which a plurality of ceramic layers 21 are stacked, inner conductors 30 disposed inside the ceramic insulator 20, and outer conductors 40 disposed outside the ceramic insulator 20.

The inner conductor 30 may be an interlayer connection conductor portion 31 that establishes electrical connection through a plurality of ceramic layers 21 or a wiring conductor portion 32 serving as the wiring conductor.

A multilayer ceramic capacitor 50, an IC 60, and the like serving as chip components are mounted on outer conductors 40 (outer conductors shown in an upper part of FIG. 1) disposed on one principal surface of the multilayer ceramic substrate 10. Bonding materials 61, for example, solder, may be used for mounting the chip components on the outer conductors 40. Meanwhile, outer conductors 40 (outer conductors shown in a lower part of FIG. 1) disposed on the other principal surface of the multilayer ceramic substrate 10 are used as electrical connection devices when the multilayer ceramic substrate 10 on which the chip components are mounted is installed on a motherboard (not shown).

In the multilayer ceramic substrate 10 serving as the ceramic electronic component according to the present disclosure, at least one of the conductor portions including the inner conductors 30 and the outer conductors 40 includes a flat portion in which the conductor thickness is constant, surface corner portions having a round-chamfered shape in the direction from the surface toward the back surface of the inner conductor or the outer conductor, and back surface corner portions having a round-chamfered shape in the direction from the back surface toward the surface of the inner conductor or the outer conductor.

In particular, it is preferable that the inner conductor 30 of the conductor portions be composed of the flat portion, the surface corner portions, and the back surface corner portions. Examples of the shape of such a conductor portion will be described later in detail.

Examples of the chip component include chip components to be mounted on multilayer ceramic substrates, for example, multilayer ceramic electronic components such as a multilayer ceramic capacitor, a multilayer inductor, and an LC composite component, e.g., a multilayer filter. In addition, various ceramic electronic components other than the multilayer ceramic electronic components may also be applicable.

Figure 2:
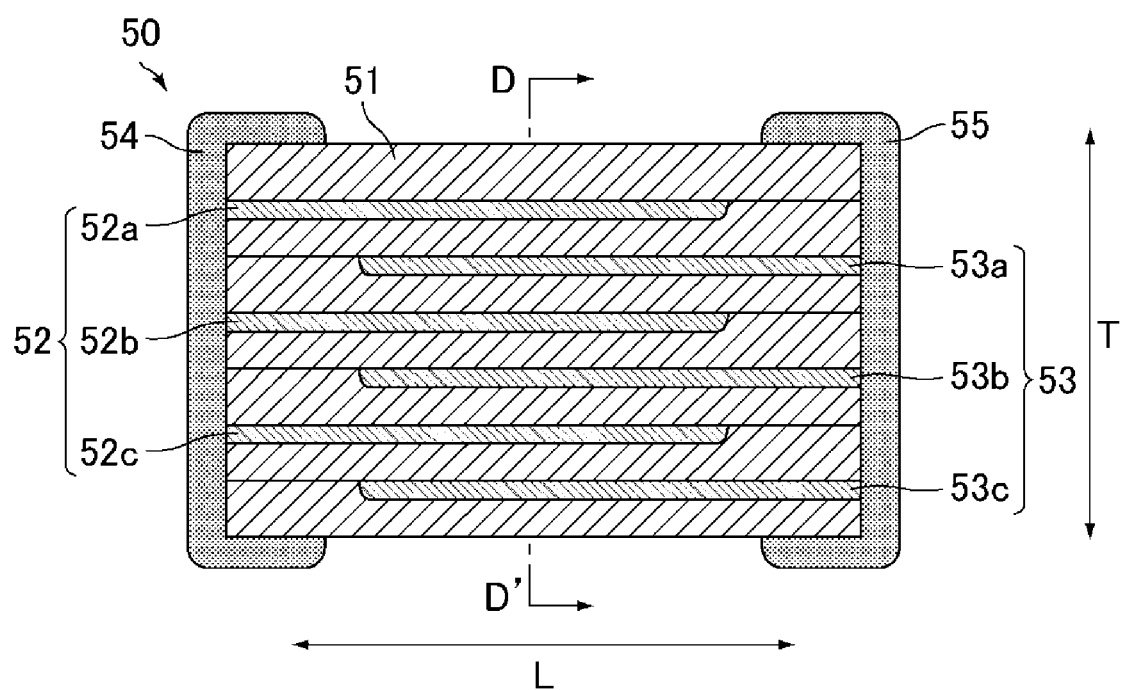
FIG. 2 is a schematic sectional view showing an example of a multilayer ceramic capacitor.

FIG. 2 is a schematic sectional view showing an example of a multilayer ceramic capacitor.

The sectional view shown in FIG. 2 is an LT sectional view showing the multilayer ceramic capacitor in the length direction (L-direction) and in the thickness direction (T-direction).

The multilayer ceramic capacitor 50 shown in FIG. 2 includes a ceramic insulator 51, in which a plurality of dielectric layers are stacked, and an inner electrode layer 52 (inner electrode layers 52a, 52b, and 52c) and an inner electrode layer 53 (inner electrode layers 53a, 53b, and 53c) that are inner conductors disposed inside the ceramic insulator 51.

The inner electrode layer 52 and the inner electrode layer 53 are arranged between the dielectric layers, the inner electrode layer 52 is connected to an outer electrode 54 serving as an outer conductor, and the inner electrode layer 53 is connected to an outer electrode 55 serving as an outer conductor.

In this regard, an electrostatic capacitance is generated between opposing layers of the inner electrode layer 52 and the inner electrode layer 53.

In the multilayer ceramic capacitor 50 serving as the ceramic electronic component according to the present disclosure, the inner electrode layer serving as the conductor portion (inner conductor) includes a flat portion in which the conductor thickness is constant, surface corner portions having a round-chamfered shape in the direction from the surface toward the back surface of the inner conductor, and back surface corner portions having a round-chamfered shape in the direction from the back surface toward the surface of the inner conductor. Examples of the shape of such a conductor portion will be described later in detail.

Figure 3A:
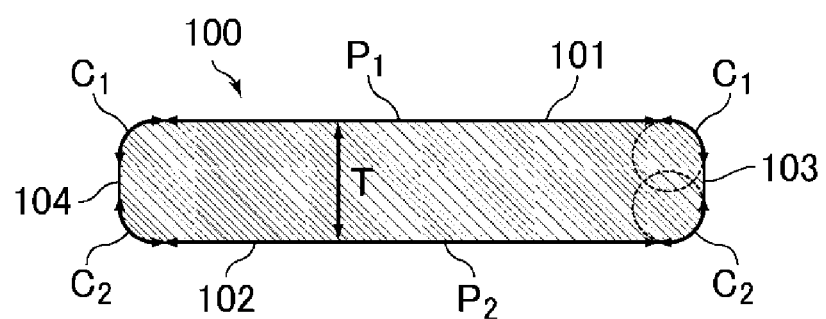
FIG. 3A, FIG. 3B, and FIG. 3C are schematic sectional views showing examples of the shape of a conductor portion.
Figure 3B:
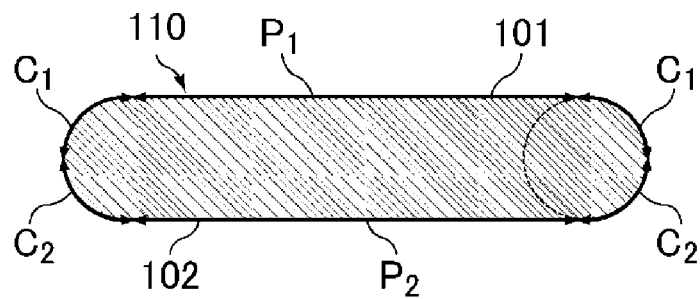
Figure 3C:
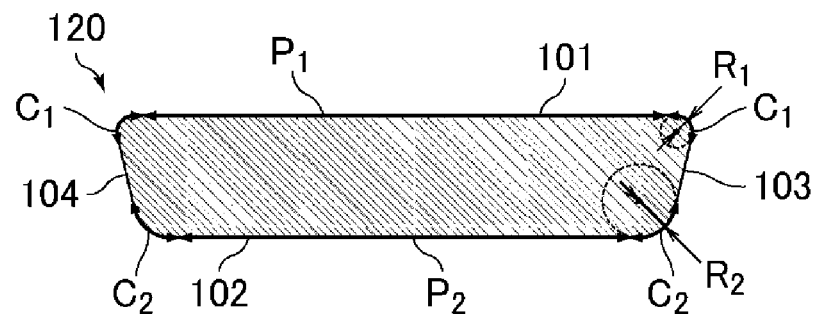

FIG. 3A, FIG. 3B, and FIG. 3C are schematic sectional views showing examples of the shape of a conductor portion.

A conductor portion 100 as shown in FIG. 3A has a surface 101 and a back surface 102 opposite to the surface 101 and includes a flat portion (indicated by two-way arrow $P_1$ and two-way arrow $P_2$) in which the conductor thickness is constant, surface corner portions (indicated by two-way arrows $C_1$) from the surface 101 toward the back surface 102, and back surface corner portions (indicated by two-way arrows $C_2$) from the back surface 102 toward the surface 101.

There is a side surface 103 and a side surface 104 that are flat surfaces between the surface corner portion $C_1$ and the back surface corner portion $C_2$.

The surface corner portion $C_1$ and the back surface corner portion $C_2$ that are end portions of the conductor portion 100 have round-chamfered shapes and do not have a shape with a pointed end. Consequently, the degradation of the characteristics due to the edge effect can be suppressed.

In the conductor portion 100 shown in FIG. 3A, the surface corner portion $C_1$ and the back surface corner portion $C_2$ have the same curvature radius. The curvature radius of the surface corner portion or the back surface corner portion is the radius of an inscribed circle of the corner portion.

Meanwhile, most of the conductor portion 100 is a flat portion in which the thickness of the conductor is constant. The thickness of the flat portion is the distance between the flat portion $P_1$ and the flat portion $P_2$ (indicated by two-way arrow T) and can be decreased. Therefore, a requirement for a reduction in profile can be satisfied.

In the present specification, the width of the conductor portion is denoted as the width of the flat portion. In the conductor portion 100 shown in FIG. 3A, the width of the flat portion of the surface (a length indicated by two-way arrow $P_1$) is the same as that of the back surface (indicated by two-way arrow $P_2$) and, therefore, the width of the conductor portion of the surface is the same as that of the back surface.

In this regard, in the present specification, the constant thickness of the conductor denotes that the variation in the thickness (a difference between the maximum value of the thickness and the minimum value of the thickness) of the flat portion is 3 µm or less.

When the thickness of the flat portion and the variations in the thickness are determined, in the case in which the width of the flat portion of the surface of the conductor portion is different from that of the back surface (in the case shown in FIG. 3C), the thickness is determined on the basis of the portion in which the flat portions are opposite to each other, and the portion in which the flat portion and the corner portion are opposite to each other is not taken into consideration.

In the conductor portion 110 shown in FIG. 3B, the end near the back surface of the surface corner portion $C_1$ is connected to the end near the surface of the back surface corner portion $C_2$, and no side surface that is a flat surface is present between the surface corner portion $C_1$ and the back surface corner portion $C_2$. Other configurations are the same as those of the conductor portion 100 shown in FIG. 3A. In the conductor portion 110 shown in FIG. 3B, the surface corner portion $C_1$ and the back surface corner portion $C_2$ have the same curvature radius. In FIG. 3B, the dotted line indicating the curvature radius of the surface corner portion $C_1$ is in accord with the dotted line indicating the curvature radius of the back surface corner portion $C_2$.

In the conductor portion 120 shown in FIG. 3C, the curvature radius of the surface corner portion $C_1$ is different from the curvature radius of the back surface corner portion $C_2$, and the curvature radius of the back surface corner portion $C_2$ is greater than the curvature radius of the surface corner portion $C_1$.

A side surface 103 and a side surface 104 that are flat surfaces are present between the surface corner portion $C_1$ and the back surface corner portion $C_2$.

In FIG. 3C, the curvature radius of the surface corner portion $C_1$ is indicated by $R_1$, the curvature radius of the back surface corner portion $C_2$ is indicated by $R_2$, and $R_2 > R_1$ applies. Meanwhile, regarding the conductor portion 120 shown in FIG. 3C, the width of the conductor portion of the surface is different from the width of the conductor portion of the back surface. Specifically, the width of the conductor portion of the surface (the length indicated by two-way arrow $P_1$) is greater than the width of the conductor portion of the back surface (the length indicated by two-way arrow $P_2$).

The shape of the entire conductor portion 120 shown in FIG. 3C is substantially trapezoidal, and it is preferable that the cross-sectional shape of the conductor portion of the ceramic electronic component according to the present disclosure be substantially trapezoidal as described above.

When the curvature radius $R_1$ of the surface corner portion $C_1$ is different from the curvature radius $R_2$ of the back surface corner portion $C_2$, regarding the preferable range of the curvature radius, $R_1$ is 0.1 µm or more and 15 µm or less, and $R_2$ is 0.1 µm or more and 1,000 µm or less. Meanwhile, when the width of the conductor portion of the surface is different from that of the back surface, the ratio of the widths (ratio represented by $P_2/P_1$) of the conductor portion is preferably 0.6 or more and 0.98 or less.

Next, specific examples of the ceramic electronic components including the above-described conductor portions and effects exerted by each of the ceramic electronic components including the above-described conductor portions will be described.

The ceramic electronic component described below may include the conductor portion in any one of the forms shown in FIG. 3A, FIG. 3B, and FIG. 3C, and an example in which the conductor portion having a substantially trapezoidal cross-sectional shape as shown in FIG. 3C is included will be described unless otherwise specified.

Figure 4A:
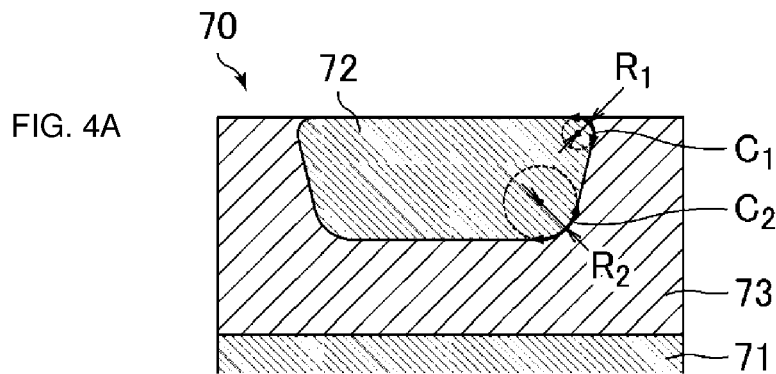
FIG. 4A is a schematic sectional view showing a part of a ceramic electronic component including a microstrip line.

FIG. 4A is a schematic sectional view showing a part of a ceramic electronic component including a microstrip line. In a ceramic electronic component 70, a transmission line 72 is a conductor portion including surface corner portions and back surface corner portions that have round-chamfered shapes, and the conductor portion has a substantially trapezoidal shape as shown in FIG. 3C. A ceramic insulator 73 is disposed between a ground 71 and the transmission line 72.

In particular, regarding the transmission line 72, it is preferable that the curvature radius $R_2$ of the back surface corner portion $C_2$ located near the ground 71 be set to be greater than the curvature radius $R_1$ of the surface corner portion $C_1$ located opposite to the ground 71.

When the curvature radius of the corner portion opposite to the ground 71 of the transmission line 72 is increased, the concentration of the electric field on an electrode end portion can be relaxed, and improved transmission characteristics can be realized.

Figure 4B:
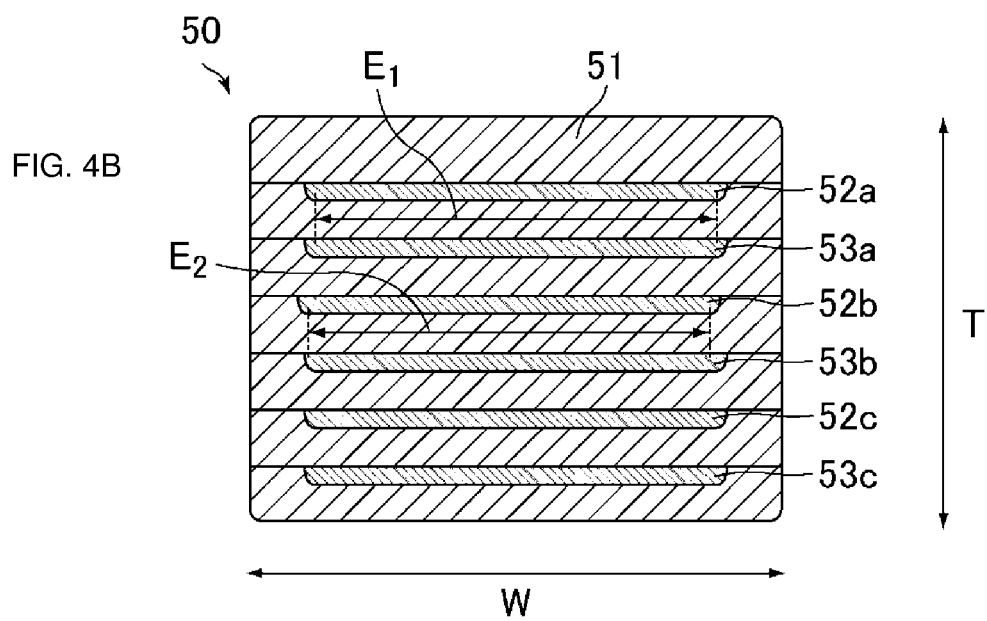
FIG. 4B is a schematic sectional view showing an example of a multilayer ceramic capacitor.

FIG. 4B is a schematic sectional view showing an example of a multilayer ceramic capacitor and is a WT sectional view showing the multilayer ceramic capacitor in the width direction (W-direction) and the thickness direction (T-direction).

The configuration of the multilayer ceramic capacitor is the same as the configuration of the multilayer ceramic capacitor shown in FIG. 2. However, for the sake of facilitating the explanation of the relationship between the shape of the conductor portion and the effect thereof, a sectional view in a different direction is shown.

FIG. 4B shows a cross section of the multilayer ceramic capacitor 50 in FIG. 2 cut at a position (in the length direction at or around the center; a cross section along line D-D' in FIG. 2) not including the outer electrode.

In the multilayer ceramic capacitor 50, each of the inner electrode layer 52 and the inner electrode layer 53 corresponds to the conductor portion having a substantially trapezoidal shape shown in FIG. 3C. In this regard, the directions of the trapezoids (the direction of the taper) of the inner electrode layers are in accord with each other.

In the multilayer ceramic capacitor, as the area in which the electrodes are opposed to each other increases, a higher capacitance can be obtained. However, if the positions of the electrode layers opposite to each other are deviated, the intended capacitance cannot be obtained.

In FIG. 4B, the inner electrode layer 52a and the inner electrode layer 53a are examples in which the positions of electrode layers opposite to each other in the width direction, as indicated by two-way arrow $E_1$, are in accord with each other, and therefore, the intended capacitance can be obtained.

In FIG. 4B, an inner electrode layer 52b shows an example in which the position of the electrode layer is deviated.

The width in which the inner electrode layer 52b and the inner electrode layer 53b (the width indicated by two-way arrow $E_2$) is the same as the width indicated by two-way arrow $E_1$ described above, despite the position of the inner electrode layer 52b being deviated.

Accordingly, each of the inner electrode layer 52 and the inner electrode layer 53 corresponds to the conductor portion having a substantially trapezoidal shape shown in FIG. 3C and, therefore, the positional deviation in stacking of the inner electrode layers within a length corresponding to the difference between the long side and the short side of the trapezoid can be absorbed.

Regarding the multilayer ceramic capacitor in which electrodes having a substantially trapezoidal cross-sectional shape are stacked, the amount of the fluctuation in the capacitance characteristics due to the positional deviation of the electrode can be reduced.

Figure 4C:
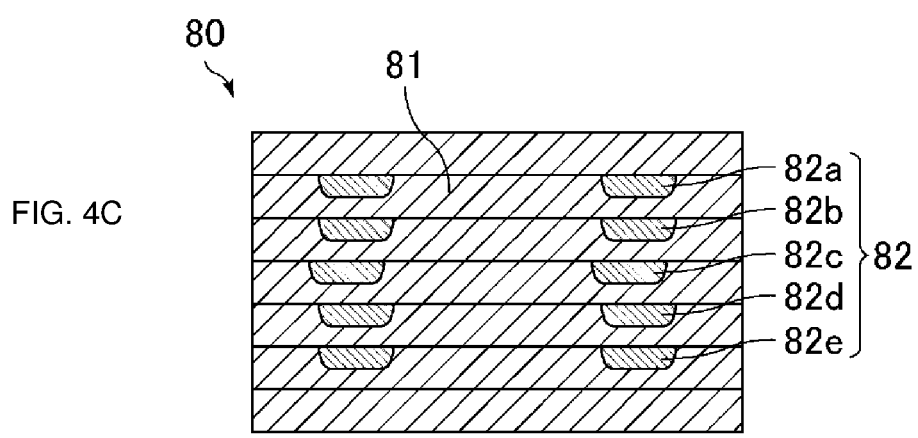
FIG. 4C is a schematic sectional view showing an example of a multilayer ceramic coil.

FIG. 4C is a schematic sectional view showing an example of a multilayer ceramic coil.

In a multilayer ceramic coil 80, five inner electrode layers are shown as conductor portions disposed inside a ceramic insulator 81, and each inner electrode layer 82 (82a, 82b, 82c, 82d, and 82e) corresponds to the substantially trapezoidal conductor portion shown in FIG. 3C. In this regard, the directions of the trapezoids (the direction of the taper) of the inner electrode layers are in accord with each other.

FIG. 4C shows an example in which the position of only an inner electrode layer 82c of five electrode layers is deviated. In the multilayer ceramic coil, stray capacitance is generated between the adjacent inner electrode layers. However, as in the case of the above-described multilayer ceramic capacitor, when each of the inner electrode layers corresponds to the conductor portion having a substantially trapezoidal shape shown in FIG. 3C, the positional deviation in stacking of the inner electrode layers within a length corresponding to the difference between the long side and the short side of the trapezoid can be absorbed, and the variations in the stray capacitance can be reduced.

Meanwhile, in the multilayer ceramic coil, electrodes are stacked in the same place and, therefore, a difference in the stress due to pressing tends to occur between an area with an electrode and an area with no electrode. When a thin ceramic sheet is used, a sheet defect is caused in some cases. However, when the corner portions of the surface and the back surface of the conductor portion have round-chamfered shapes, the risk of the generation of the sheet defect can be reduced.

Figure 5A:
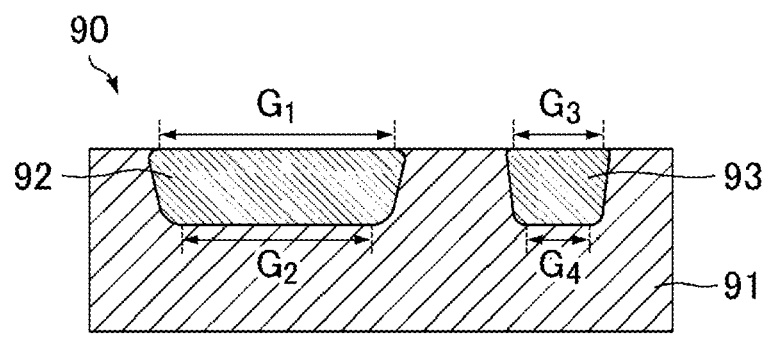
FIG. 5A is a schematic sectional view showing a part of a ceramic electronic component including a plurality of types of conductor portions in which the widths of the conductor portions of the surfaces are different from each other.

FIG. 5A is a schematic sectional view showing a part of a ceramic electronic component including a plurality of types of conductor portions in which the widths of the conductor portions of the surfaces are different from each other.

FIG. 5A shows a ceramic insulator 91 of a ceramic electronic component 90, a wide conductor portion 92, and a narrow conductor portion 93.

Each of the conductor portion 92 and the conductor portion 93 corresponds to the conductor portion having a substantially trapezoidal shape shown in FIG. 3C.

The wide conductor portion 92 is a conductor portion effective for forming electrostatic capacitance.

In the conductor portion 92, the width of the conductor portion of the surface is a width indicated by two-way arrow $G_1$, and the width of the conductor portion of the back surface is a width indicated by two-way arrow $G_2$. In the case of the conductor portion for forming electrostatic capacitance, in the same manner as the inner electrode layer of the multilayer ceramic capacitor, the amount of the fluctuation in the capacitance characteristics due to the positional deviation of the electrode can be reduced by setting the shape of the conductor portion to be substantially trapezoidal.

Consequently, it is effective to increase the difference between the width of the conductor portion of the surface and the width of the conductor portion of the back surface (the length represented by $G_1-G_2$).

The narrow conductor portion 93 is a conductor portion effectively used for signal transmission.

In the conductor portion 93, the width of the conductor portion of the surface is a width indicated by two-way arrow $G_3$, and the width of the conductor portion of the back surface is a width indicated by two-way arrow $G_4$.

If the difference between the width of the conductor portion of the surface and the width of the conductor portion of the back surface (the length represented by $G_3-G_4$) increases, the cross-sectional area of the conductor portion decreases so as to cause the degradation in the transmission characteristics. Therefore, it is effective to decrease the difference.

Consequently, regarding the ceramic electronic component including a plurality of types of conductor portions in which the widths of the conductor portions of the surfaces are different from each other, it is preferable that the difference between the width of the conductor portion of the surface and the width of the conductor portion of the back surface be increased in the wide conductor portion, and it is preferable that the difference between the width of the conductor portion of the surface and the width of the conductor portion of the back surface be decreased in the narrow conductor portion.

Figure 5B:
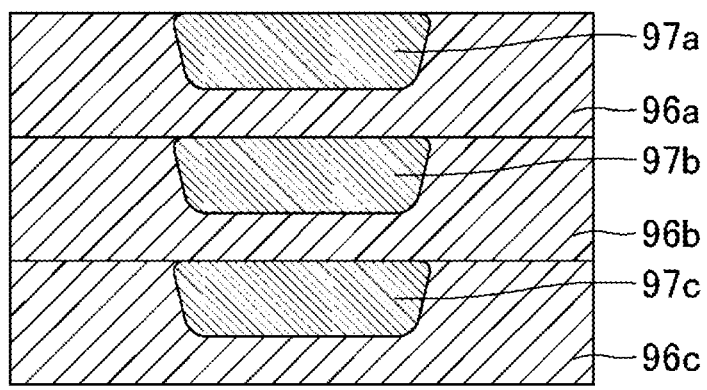
FIG. 5B is a schematic sectional view showing a part of a ceramic electronic component in which embedded conductor portions that are conductor portions embedded in a ceramic insulator are present.
Figure 6A:
FIG. 6A is a schematic sectional view showing a cross-sectional shape of an electrode that is described in Patent Document 1 and that is formed by etching metal foil.
Figure 6B:
FIG. 6B is a schematic sectional view showing a cross-sectional shape of an electrode formed by applying a conductive paste by screen printing.

FIG. 5B is a schematic sectional view showing a part of a ceramic electronic component in which an embedded conductor portion that is a conductor portion embedded in a ceramic insulator is present.

FIG. 5B shows a ceramic electronic component 95 in which a ceramic insulator is an insulator composed of a plurality of ceramic layers 96a, 96b, and 96c stacked.

A conductor portion 97a, a conductor portion 97b, and a conductor portion 97c are embedded in the ceramic layer 96a, the ceramic layer 96b, and the ceramic layer 96c, respectively. Such a conductor portion is also referred to as an embedded conductor portion.

In this regard, preferably, the surface of each ceramic layer and the surface of each embedded conductor portion form a flat surface. The ceramic electronic component having good coplanarity can be produced by embedding the conductor portion in each ceramic layer.

Meanwhile, if conductor portions are stacked in the same place while the conductor portions are not embedded in the ceramic layers and pressing is performed, there is a concern that the ceramic layer between the conductor portions may become excessively thin during pressing, and the insulation reliability between the ceramic layers may be degraded. However, this problem can also be addressed by embedding the conductor portion in each ceramic layer.

Meanwhile, when the embedded conductor portion is formed by screen printing, the variations tend to occur in the thickness of the conductor portion and, thereby, the manner of embedding of the embedded conductor portions may become uneven. If inadequately embedded conductor portions are stacked in the same place, the ceramic layer may become excessively thin. From this point of view, it is preferable that the conductor portion is formed by using a photosensitive conductive paste.

When the end portion of the conductor portion has a round-chamfered shape, the concentration of stress in the end portion is relaxed during embedding the conductor portion into the ceramic insulator, and the generation of structural defects, for example, a crack, is suppressed.

FIG. 5B shows only a part of the ceramic electronic component. However, only the inner conductor may be the embedded conductor portion, only the outer conductor may be the embedded conductor portion, or both the inner conductor and the outer conductor may be the embedded conductor portions.

Meanwhile, in the case of a ceramic electronic component including a constraining layer so as to suppress shrinkage of the ceramic layer, the conductor portion may be embedded in the constraining layer.

Preferably, the material constituting the ceramic insulator contains a low-temperature-sintering ceramic material. The low-temperature-sintering ceramic material refers to a material that is a ceramic material, that can be sintered at a firing temperature of 1,000° C. or lower, and that can be co-fired with Ag, Cu, or the like.

Examples of the low-temperature-sintering ceramic material include a glass-composite-based low-temperature-sintering ceramic material produced by mixing borosilicate glass into quartz or a ceramic material, for example, alumina, or forsterite, a crystallized-glass-based low-temperature-sintering ceramic material using $ZnO$—$MgO$—$Al_2O_3$—$SiO_2$-based crystallized glass, and a non-glass-based low-temperature-sintering ceramic material using a $BaO$—$Al_2O_3$—$SiO_2$-based ceramic material or an $Al_2O_3$—$CaO$—$SiO_2$—$MgO$—$B_2O_3$-based ceramic material.

Preferably, the material constituting the conductor portion contains a metal material. In this regard, a ceramic material or a glass material may be added.

Preferably, Au, Ag, or Cu is contained as the metal material, and more preferably, Ag or Cu is contained. Each of Au, Ag, and Cu has low resistance and, therefore, is particularly suitable for the case in which the ceramic electronic component is used at high frequency.

In this regard, examples of the ceramic material include alumina and titania.

Examples of the glass material include silica and boron.

In addition, it is preferable that a ceramic component such as alumina or titania be distributed on the border surface between the ceramic insulator and the conductor portion. An effect of suppressing the sintering shrinkage and an effect of improving the close contact property in a high-temperature range are expected.

When the conductor portion including the surface corner portions and the back surface corner portions includes a wiring conductor portion and an interlayer connection conductor portion that establishes electrical connection through a plurality of ceramic layers, the composition of the material for constituting the interlayer connection conductor portion may have a larger content of ceramic component than the composition of the material for constituting the wiring conductor portion, or the composition of the material for constituting the interlayer connection conductor portion may be the same as the composition of the material for constituting the wiring conductor portion.

In the case in which the composition of the material for constituting the interlayer connection conductor portion has a larger content of ceramic component than the composition of the material for constituting the wiring conductor portion, regarding the interlayer connection conductor portion, a larger content of ceramic component in the conductor portion is advantageous from the viewpoint of exerting a shrinkage suppression effect. On the other hand, regarding the wiring conductor portion, a relatively small content of ceramic component in the conductor portion is advantageous from the viewpoint of an improving the transmission characteristics.

In the case in which the composition of the material for constituting the interlayer connection conductor portion is the same as the composition of the material for constituting the wiring conductor portion, there is an advantage from the viewpoint of relaxing the stress applied during the firing shrinkage.

In the case in which the conductor portion including the surface corner portions and the back surface corner portions includes the wiring conductor portion and the interlayer connection conductor portion that establishes electrical connection through a plurality of ceramic layers, regarding both the interlayer connection conductor portion and the wiring conductor portion, it is preferable that the width of the flat portion of the surface of the conductor portion be different from the width of the flat portion of the back surface, and it is preferable that the tendency of change in the width of the flat portion of the conductor portion from the surface to the back surface be the same between the interlayer connection conductor portion and the wiring conductor portion. That is, it is preferable that the interlayer connection conductor portion and the wiring conductor portion have the same direction of the taper of the cross-sectional shape.

The same direction of the taper is advantageous from the viewpoint of relaxing the stress applied during the firing shrinkage.

At least one of the conductor portions of the ceramic electronic component according to the present disclosure may be a conductor portion including the surface corner portions and the back surface corner portions, and a conductor portion including no corner portion may be present. Meanwhile, a conductor portion that does not include any one of the surface corner portion and the back surface corner portion may be present.

Next, an example of a method for manufacturing the ceramic electronic component according to the present disclosure will be described. A method for manufacturing the ceramic electronic component that is the multilayer ceramic substrate shown in FIG. 1 will be described below.

Preferably, the method for manufacturing the ceramic electronic component according to the present disclosure includes a step of preparing ceramic green sheets containing a raw material powder for a ceramic insulator, a conductive paste providing step of providing a photosensitive conductive paste on the ceramic green sheets, a pattern forming step of forming a conductor pattern by subjecting the conductive paste to exposure through a mask and to development, and a step of firing the ceramic green sheets provided with the patterns.

Initially, the ceramic green sheets containing the raw material powder for the ceramic insulator are prepared. The ceramic green sheets serve as ceramic layers after firing.

The ceramic green sheet is produced by forming a slurry containing a powder of a ceramic raw material, for example, a low-temperature-sintering ceramic material, an organic binder, and a solvent into a sheet-like shape by a doctor blade method or the like. The slurry may contain various additives, for example, a dispersing agent and a plasticizer.

There is no particular limitation regarding the thickness of the ceramic green sheet, and for example, 5 μm or more and 100 μm or less is preferable.

As the situation demands, a through hole for forming the interlayer connection conductor portion is formed in a specific ceramic green sheet. The through hole can be formed by using a mechanical punch, a $CO_2$ laser, an UV laser, or the like. The hole diameter is arbitrary and is set to be preferably, for example, 20 μm or more and 200 μm or less.

Subsequently, the conductive paste providing step of providing a photosensitive conductive paste on the ceramic green sheets is performed.
Preferably, the photosensitive conductive paste is applied to the entire ceramic green sheet by solid printing. In this regard, when the through hole is located in the ceramic green sheet, the through hole may be filled with the photosensitive conductive paste.
Meanwhile, the through hole may be filled with a conductive paste having no photosensitivity.

Preferably, the photosensitive conductive paste contains a metal material and a photosensitive organic component.
In addition, a ceramic material or a glass material may be contained.
The metal material is the same as the metal material described as the material for constituting the conductor portion.
There is no particular limitation regarding the content of the metal material in the photosensitive conductive paste, and 70% by weight or more and 95% by weight or less is preferable.

Regarding the photosensitive organic component, for example, an alkali-soluble polymer, a photosensitive monomer, and a photopolymerization initiator are contained.

Regarding the alkali-soluble polymer, for example, an acrylic polymer having a carboxy group in a side chain can be used. The acrylic polymer having a carboxy group in a side chain can be produced by, for example, copolymerizing an unsaturated carboxylic acid and an ethylenic unsaturated compound.
Examples of the unsaturated carboxylic acid include acrylic acid, methacrylic acid, maleic acid, fumaric acid, and vinyl acetate and anhydrides thereof. Meanwhile, examples of the ethylenic unsaturated compound include acrylic acid esters, for example, methyl acrylate and ethyl acrylate, methacrylic acid esters, for example, methyl methacrylate and ethyl methacrylate, and fumaric acid esters, for example, monoethylfumarate.
In this regard, an acrylic copolymer having a carboxy group in a side chain and including an unsaturated bond in the following form may be used.
1) An acrylic monomer having a functional group, for example, an epoxy group, that can react with the carboxy group in the side chain of the acrylic copolymer is added to the carboxy group in the side chain of the acrylic copolymer.
2) The above-described acrylic copolymer in which an epoxy group is introduced instead of the carboxy group in the side chain is reacted with an unsaturated monocarboxylic acid and, thereafter, a saturated or unsaturated polyvalent carboxylic anhydride is further introduced.
In addition, preferably, the acrylic copolymer having a carboxy group in a side chain has a weight average molecular weight (Mw) of 50,000 or less and an acid value of 30 or more and 150 or less.

Regarding the photosensitive monomer, for example, dipentaerythritol monohydroxypentaacrylate can be used. In addition, for example, hexanediol triacrylate, tripropylene glycol triacrylate, trimethylolpropane triacrylate, EO-modified trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,3-butanediol diacrylate, 1,4-butanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl)isocyanurate triacrylate, pentaerythritol triacrylate, propoxylated trimethylolpropane triacrylate, propoxylated glyceryl triacrylate, pentaerythritol tetraacrylate, ditrimethylolpropane tetraacrylate, and ethoxylated pentaerythritol tetraacrylate can be used as the photosensitive monomer. Further, compounds in which all or some of acrylates in the molecule of the above-described compounds are changed to methacrylates can also be used.

Regarding the photopolymerization initiator, for example, 2-methyl-1-[4-(methylthio)phenyl]-2-morpholinopropan-1-on can be used. In addition, for example, benzyl, benzoin ethyl ether, benzoin isobutyl ether, benzoin isopropyl ether, benzophenone, benzoylbenzoic acid, methyl benzoylbenzoate, 4-benzoyl-4'-methyldiphenyl sulfide, benzylmethyl ketal, 2-n-butoxy-4-dimethylaminobenzoate, 2-chlorothioxanthone, 2,4-diethylthioxanthone, 2,4-diisopropylthioxanthone, isopropylthioxanthone, 2-dimethylaminoethylbenzoate, ethyl p-dimethylaminobenzoate, isoamyl p-dimethylaminobenzoate, 3,3'-dimethyl-4-methoxybenzophenone, 2,4-dimethylthioxanthone, 1-(4-dodecylphenyl)-2-hydroxy-2-methylpropan-1-on, 2,2-dimethoxy-1,2-diphenylethan-1-on, hydroxycyclohexyl phenyl ketone, 2-hydroxy-2-methyl-1-phenylpropan-1-on, 1-[4-(2-hydroxyethoxy)-phenyl]-2-hydroxy-2-methyl-1-propan-1-on, methyl benzoylformate, 1-phenyl-1,2-propanedione-2-(o-ethoxycarbonyl)oxime, 2-benzyl-2-dimethylamino-1-(4-morpholinophenyl)-1-butanone, bis(2,6-dimethoxybenzoyl)-2,4,4-trimethylpentylphosphine oxide, and bis(2,4,6-trimethylbenzoyl)phenylphosphine oxide can be used as the photopolymerization initiator.

Preferably, the photosensitive conductive paste contains a solvent serving as the photosensitive organic component. In addition, a sensitizing agent, an antifoaming agent, and the like may be contained. There is no particular limitation regarding the solvent, the sensitizing agent, and the antifoaming agent, and various materials can be used.

There is no particular limitation regarding the content of the photosensitive organic component in the photosensitive conductive paste, and 70% by weight or more and 95% by weight or less is preferable.

The photosensitive conductive paste may contain other additives, for example, a dispersing agent and an anti-settling agent.

The conductor pattern is formed by subjecting the photosensitive conductive paste provided on the ceramic green sheet to exposure through a mask and to development. A wiring conductor portion serving as the wiring conductor is disposed by forming the conductor pattern.
Exposure is performed by using UV light, and the conductor pattern can be formed by removing unhardened portions by using a weak alkaline developing solution.

The shape of the conductor portion formed by the above-described method is a shape composed of a flat portion in which the conductor thickness is constant, surface corner portions having a round-chamfered shape in the direction from the surface toward the back surface of the inner conductor or the outer conductor, and back surface corner portions having a round-chamfered shape in the direction from the back surface toward the surface of the inner conductor or the outer conductor.

Regarding the shape of the conductor portion, the curvature radius of each corner portion and the width of the conductor portion of each of the surface and the back surface can be adjusted by optimizing the average particle diameter of the metal material (a diameter of preferably 1 µm or more and 5 µm or less), the print film thickness (preferably 5 µm or more and 20 µm or less), the exposure condition (preferably 10 mJ or more and 2,000 mJ or less), and the development condition (development time, concentration or composition of development solution, development temperature, and the like).

In this regard, in addition to the conductor portion formed by using the photosensitive conductive paste, the conductor portion may be formed by screen printing the green sheet with the conductive paste.

Alternatively, when a plurality of green sheets provided with the pattern are prepared, both the green sheets having the conductor portion formed by using the photosensitive conductive paste and the green sheets formed by screen printing of the conductive paste may be prepared.

A multilayer body is formed by stacking the green sheets provided with the pattern and performing pressure bonding. The pressure and the temperature during pressure bonding can be set arbitrarily.

At this time, the shape of the conductor portion can also be adjusted by applying an appropriate pressure.

Then, the multilayer body in the state of being put on a firing jig, for example, a setter or a saggar, is placed into a firing furnace, and firing is performed. A batch furnace or a belt furnace can be used as the firing furnace.

In this regard, when copper is used as the metal material for forming the conductor portion, it is preferable that firing be performed in a reducing atmosphere.

As the situation demands, it is preferable that a break line be formed before firing. Regarding the method for forming the break line, a laser, a guillotine cutter (half cutter), a dicer (half cutter), or the like can be selected.

The sintering shrinkage behavior of the conductor portion can be adjusted, the corner portions can be formed in the conductor portion, and the shape of the conductor portion can be adjusted by optimizing the firing atmosphere, the firing temperature, and the temperature increasing rate in the firing step.

As the situation demands, it is preferable that the outer conductor after firing be subjected to plating. Regarding the plating, Ni—Sn plating, electroless Au plating, or the like can be selected.

After firing and plating are finished, breaking is performed along the break line so as to divide into the individual ceramic electronic components.

In the above-described method for manufacturing the ceramic electronic component, a constraining green sheet containing, as a primary component, an inorganic material (for example, $Al_2O_3$) that does not substantially sinter at a sintering temperature of the green multilayer body before firing may be prepared, and the green multilayer body may be fired in the state in which the constraining green sheet is arranged on the outermost surface of the green multilayer body. In this case, the constraining green sheet does not substantially sinter during firing so as not to cause shrinkage and, therefore, functions to suppress the shrinkage of the multilayer body in the principal surface direction. As a result, the dimension accuracy of the ceramic electronic component can be enhanced.

10 multilayer ceramic substrate (ceramic electronic component)
20, 51, 73, 81, 91 ceramic insulator
21, 96a, 96b, 96c ceramic layer
30 inner conductor
31 interlayer connection conductor portion
32 wiring conductor portion
40 outer conductor
50 multilayer ceramic capacitor (ceramic electronic component)
52, 52a, 52b, 52c, 53, 53a, 53b, 53c (multilayer ceramic capacitor) inner electrode layer
54, 55 outer electrode
60 IC
61 bonding material
70, 90, 95 ceramic electronic component
71 ground
72 transmission line
80 multilayer ceramic coil (ceramic electronic component)
82, 82a, 82b, 82c, 82d, 82e (multilayer ceramic coil) inner electrode layer
92 wide conductor portion
93 narrow conductor portion
97, 97a, 97b, 97c embedded conductor portion
100, 110, 120 conductor portion
101 surface
102 back surface
103, 104 side surface

The invention claimed is:

1. A ceramic electronic component comprising:
a ceramic insulator; and
conductor portions including inner conductors disposed inside the ceramic insulator and outer conductors disposed outside the ceramic insulator,
wherein each of the conductor portions has a front surface and a back surface opposite to the front surface,
at least one of the conductor portions includes a flat portion having a constant conductor thickness,
front surface corner portions having a round-chamfered shape in a direction from the front surface toward the back surface of each of the inner conductors or each of the outer conductors,
and back surface corner portions having a round-chamfered shape in a direction from the back surface toward the front surface of each of the inner conductors or each of the outer conductors,
a width of the front surface of the at least one of the conductor portions including the front surface corner portions and the back surface corner portions is different from a width of the back surface of the at least one of the conductor portions,
the at least one of the conductor portions including the front surface corner portions and the back surface corner portions comprises a plurality of types of conductor portions having widths of the front surfaces different from each other, and
regarding each of the plurality of conductor portions, a difference between a width of the front surface of each of the conductor portions and a width of the back surface of each of the conductor portions increases as the width of the front surface of each of the conductor portions increases.

2. The ceramic electronic component according to claim 1, wherein the at least one of the conductor portions including the front surface corner portions and the back surface corner portions is at least one of the inner conductors.

3. The ceramic electronic component according to claim 2, wherein an end near the back surface of each of the front surface corner portions is connected to an end near the front surface of each of the back surface corner portions.

4. The ceramic electronic component according to claim 2, wherein a flat side surface is present between an end near the back surface of each of the front surface corner portions and an end near the front surface of each of the back surface corner portions.

5. The ceramic electronic component according to claim 2, wherein a curvature radius of each of the front surface corner portions is different from a curvature radius of each of the back surface corner portions.

6. The ceramic electronic component according to claim 1, wherein an end near the back surface of each of the front surface corner portions is connected to an end near the front surface of each of the back surface corner portions.

7. The ceramic electronic component according to claim 6, wherein a curvature radius of each of the front surface corner portions is different from a curvature radius of each of the back surface corner portions.

8. The ceramic electronic component according to claim 1, wherein a flat side surface is present between an end near the back surface of each of the front surface corner portions and an end near the front surface of each of the back surface corner portions.

9. The ceramic electronic component according to claim 8, wherein a curvature radius of each of the front surface corner portions is different from a curvature radius of each of the back surface corner portions.

10. The ceramic electronic component according to claim 1, wherein a curvature radius of each of the front surface corner portions is different from a curvature radius of each of the back surface corner portions.

11. The ceramic electronic component according to claim 10, wherein the at least one of the conductor portions including the front surface corner portions and the back surface corner portions is a transmission line of a microstrip line, and the curvature radius of each of the back surface corner portions located near a ground is greater than the curvature radius of each of the front surface corner portions.

12. The ceramic electronic component according to claim 1, wherein the at least one of the conductor portions including the surface corner portions and the back surface corner portions is an inner electrode layer of a multilayer ceramic capacitor.

13. The ceramic electronic component according to claim 1, wherein the at least one of the conductor portions including the surface corner portions and the back surface corner portions is an inner electrode layer of a multilayer ceramic coil.

14. The ceramic electronic component according to claim 1, wherein the at least one of the conductor portions including the front surface corner portions and the back surface corner portions comprises an embedded conductor portion embedded in the ceramic insulator, and a surface of a ceramic layer constituting the ceramic insulator and the front surface of the embedded conductor portion form a flat surface.

15. The ceramic electronic component according to claim 1,
wherein the ceramic insulator is an insulator having a plurality of ceramic layers stacked, and
the at least one of the conductor portions including the front surface corner portions and the back surface corner portions includes a wiring conductor portion and an interlayer connection conductor portion establishing an electrical connection through the plurality of ceramic layers,
and a composition of a material constituting the interlayer connection conductor portion has a larger content of a ceramic component than a composition of a material constituting the wiring conductor portion.

16. The ceramic electronic component according to claim 1,
wherein the ceramic insulator is an insulator having a plurality of ceramic layers stacked, and
the at least one of the conductor portion including the front surface corner portions and the back surface corner portions includes a wiring conductor portion and an interlayer connection conductor portion establishing an electrical connection through a plurality of ceramic layers,
and a composition of a material constituting the interlayer connection conductor portion is the same as a composition of a material constituting the wiring conductor portion.

* * * * *